(12) United States Patent
Kim et al.

(10) Patent No.: US 11,739,420 B2
(45) Date of Patent: Aug. 29, 2023

(54) METAL MASK, METHOD OF MANUFACTURING THE SAME, AND METHOD OF MANUFACTURING DISPLAY PANEL USING THE METAL MASK

(71) Applicant: Samsung Display Co., LTD., Yongin-si (KR)

(72) Inventors: Hyosung Kim, Hwaseong-si (KR); JinYoung Choi, Suwon-si (KR); Sungmin Hur, Yongin-si (KR); Hyunsang Seo, Daejeon (KR); Hyun-Ju Lee, Asan-si (KR); Manjae Park, Cheonan-si (KR); Nari Ahn, Seongnam-si (KR); Hyeongsuk Yoo, Asan-si (KR); Dongwon Han, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 126 days.

(21) Appl. No.: 16/892,415

(22) Filed: Jun. 4, 2020

(65) Prior Publication Data

US 2021/0079518 A1 Mar. 18, 2021

(30) Foreign Application Priority Data

Sep. 16, 2019 (KR) .......................... 10-2019-0113594

(51) Int. Cl.
| | | |
|---|---|---|
| C23C 16/04 | (2006.01) | |
| H01L 27/32 | (2006.01) | |
| C22C 38/08 | (2006.01) | |
| H10K 50/844 | (2023.01) | |
| H10K 59/12 | (2023.01) | |
| H10K 71/00 | (2023.01) | |
| H10K 71/10 | (2023.01) | |

(52) U.S. Cl.
CPC ............ *C23C 16/042* (2013.01); *C22C 38/08* (2013.01); *H10K 50/844* (2023.02); *H10K 59/12* (2023.02); *H10K 71/00* (2023.02); *H10K 71/10* (2023.02); *H10K 59/1201* (2023.02)

(58) Field of Classification Search
CPC ..... C23C 14/042; C23C 16/042; C23C 38/08; H10K 50/844; H10K 59/12; H10K 71/00; H10K 71/10
See application file for complete search history.

(56) References Cited

U.S. PATENT DOCUMENTS

| | | | |
|---|---|---|---|
| 9,863,037 B2 | 1/2018 | Kim et al. | |
| 10,497,598 B2* | 12/2019 | Cooke | ................. H01L 21/6833 |
| 2016/0149133 A1* | 5/2016 | Kim | ...................... C23C 14/042 |
| | | | 204/192.28 |
| 2018/0269179 A1* | 9/2018 | Sekine | .................... H01L 24/85 |

FOREIGN PATENT DOCUMENTS

| | | |
|---|---|---|
| JP | 05-142750 A | 6/1993 |
| JP | 2011-214051 A | 10/2011 |
| KR | 10-1480113 B1 | 1/2015 |
| KR | 1020160062280 B1 | 6/2016 |
| KR | 1020180077250 A | 7/2018 |

* cited by examiner

*Primary Examiner* — Savitri Mulpuri
(74) *Attorney, Agent, or Firm* — Cantor Colburn LLP

(57) ABSTRACT

A deposition mask includes a metal mask body in which a deposition opening is defined; and a coating layer including aluminum oxynitride, on an outer surface of the metal mask body.

7 Claims, 10 Drawing Sheets

METAL MASK, METHOD OF MANUFACTURING THE SAME, AND METHOD OF MANUFACTURING DISPLAY PANEL USING THE METAL MASK

This application claims priority to Korean Patent Application No. 10-2019-0113594, filed on Sep. 16, 2019, and all the benefits accruing therefrom under 35 U.S.C. § 119, the entire contents of which are hereby incorporated by reference.

BACKGROUND

(1) Field

The present disclosure herein relates to a metal mask, a method of manufacturing the same, and a method of manufacturing a display panel using the metal mask. More particularly, the present disclosure herein relates to a metal mask, a method of manufacturing the same, and a method of manufacturing a display panel having improved process yield and reliability by using the metal mask.

(2) Description of the Related Art

A display panel includes a plurality of pixels. Each of the pixels includes a driving element such as a transistor and a display element such as an organic light emitting diode. The display element may be manufactured by stacking an electrode and a light emitting pattern on a substrate and forming an encapsulation pattern thereon.

The encapsulation pattern may be patterned using a mask in which a through portion is defined in a predetermined region. The encapsulation pattern may be formed in an area corresponding to the through portion of the mask. The shape of the encapsulation pattern may be controlled according to the shape of the through portion of the mask.

SUMMARY

The present disclosure provides a metal deposition mask having improved reliability in a deposition process for forming a deposition pattern, and a method of manufacturing a display panel using the same.

The present disclosure also provides a method of manufacturing a display panel in which defects of the display panel are minimized by using a metal deposition mask in a deposition process for forming a deposition pattern, while a durability of the metal deposition mask is improved.

An embodiment provides a deposition mask including a metal mask body in which a deposition opening is defined; and a coating layer including aluminum oxynitride, on an outer surface of the metal mask body.

The coating layer may include the aluminum oxynitride represented by $AlN_x \cdot (Al_2O_3)_{1-x}$ (x=0.1 to 0.9).

The x may be 0.5.

The aluminum oxynitride may include aluminum oxide and aluminum nitride which are covalently bonded with each other.

The coating layer may include an upper coating layer disposed over an upper surface of the metal mask body, a lower coating layer disposed over a lower surface opposite to the upper surface, and an inner coating layer disposed over an inner wall of the metal mask body.

The metal mask body may include iron and nickel.

The metal mask body may include an alloy of iron and nickel.

The alloy of iron and nickel may include nickel in a range from about 30 wt % to about 40 wt % with respect to a total of 100 wt % for the metal mask body.

The coating layer may contact the metal mask body.

The coating layer may be on the metal mask body to have a thickness of about 0.1 micrometer (μm) to about 10 micrometers (μm).

In an embodiment, a method for manufacturing a metal mask includes providing a metal mask body including a deposition opening; and providing a coating layer including aluminum oxynitride, on the metal mask body.

The metal mask body may include iron and nickel, and the providing the coating layer may include providing a coating material including aluminum, together with oxygen gas and nitrogen gas, on the metal mask body which includes the iron and nickel.

The providing the metal mask body may include providing a base sheet including iron and nickel, and irradiating a laser to the base sheet to provide the deposition opening of the metal mask body.

The metal mask body may further include an upper surface, a lower surface which is opposite to the upper surface, and an inner wall extending between the upper surface and the lower surface, the inner wall defining the deposition opening. The providing the coating layer may include providing a coating material which includes aluminum, together with oxygen gas and nitrogen gas, on the inner wall of the metal mask body.

In an embodiment, a method for manufacturing a display panel includes providing a target substrate; providing a metal deposition mask in which a deposition opening is defined, over the target substrate, where the metal deposition mask includes: a metal mask body in which the deposition opening is defined; and a coating layer including aluminum oxynitride, on an outer surface of the metal mask body; and providing a deposition pattern of the display panel, on the target substrate, the deposition pattern corresponding to the deposition opening of the metal deposition mask having the coating layer.

The target substrate may include a base substrate, a plurality of circuit layers on the base substrate, and a plurality of display element layers on the plurality of circuit layers, respectively. The metal deposition mask having the coating layer may further include a plurality of deposition openings respectively corresponding to the plurality of display element layers. The method may further include providing a plurality of deposition patterns on the target substrate, respectively covering the plurality of display element layers which respectively correspond to the plurality of deposition openings of the metal deposition mask.

The plurality of display element layers may include a first display element layer and a second display element layer spaced apart from each other along the base substrate. The plurality of deposition patterns may include a first deposition pattern covering the first display element layer and a second deposition pattern covering the second display element layer. The first deposition pattern and the second deposition pattern may be spaced apart from each other along the base substrate.

Each of the plurality of deposition patterns may include in order from a respective display element layer, a first inorganic pattern, an organic pattern and a second inorganic pattern.

The plurality of deposition patterns may be provided through chemical vapor deposition ("CVD").

The method of manufacturing a display panel may further include after the providing the plurality of deposition patterns on the target substrate: separating the metal deposition mask having the coating layer from the target substrate having the plurality of deposition patterns, and dividing the target substrate into portions respectively corresponding to the plurality of deposition patterns.

BRIEF DESCRIPTION OF THE DRAWINGS

The accompanying drawings are included to provide a understanding of the invention, and are incorporated in and constitute a part of this specification. The drawings illustrate present disclosures of the invention and, together with the description, serve to describe principles of the invention. In the drawings.

DETAILED DESCRIPTION

Figure 1:
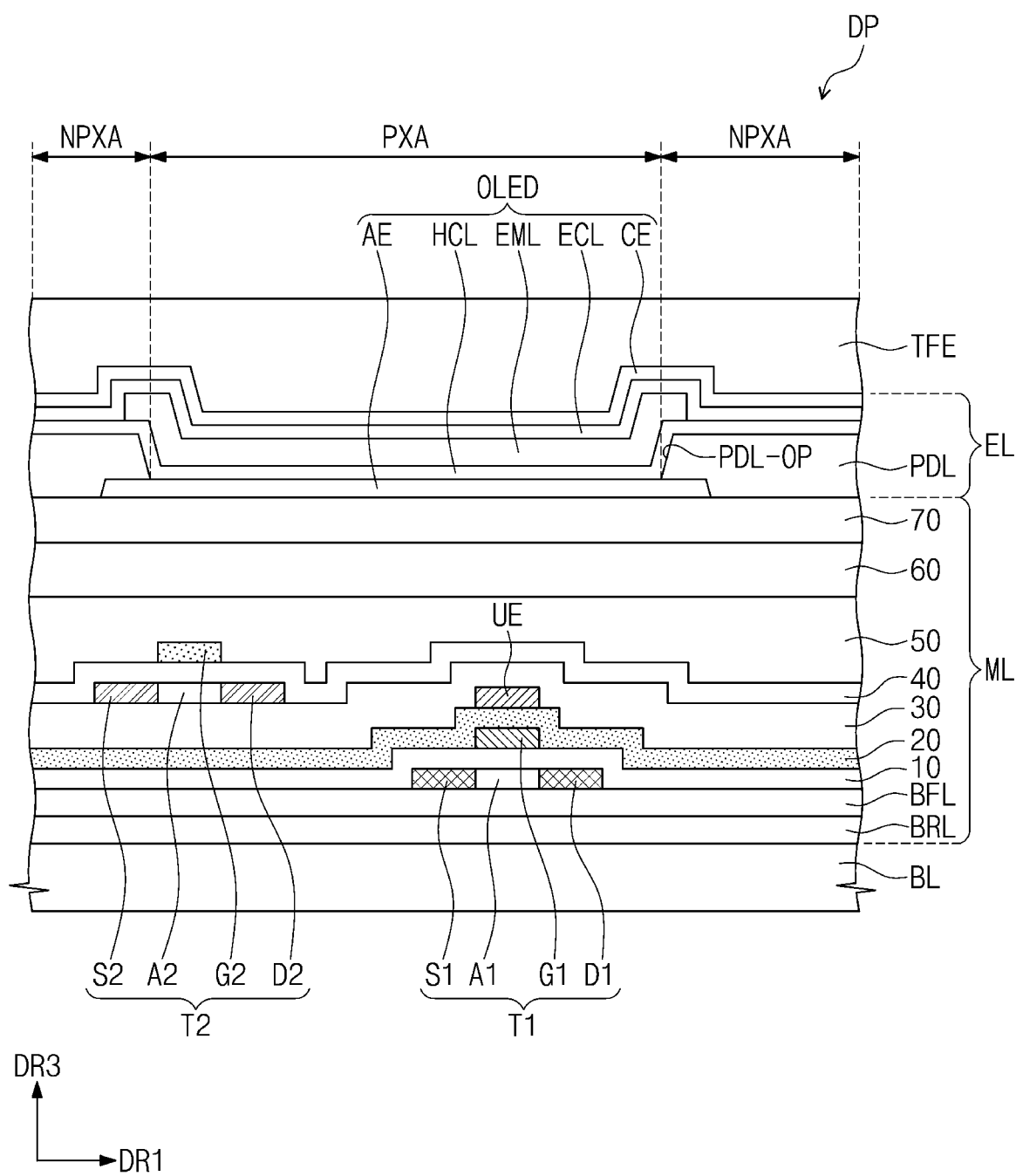
FIG. 1 is an enlarged cross-sectional view of an embodiment of a display panel.

Hereinafter, embodiments of the invention will be described with reference to the accompanying drawings. In this specification, when a component (or a region, a layer, a portion, or the like) is referred to as being related to another element such as being "on", "over", "connected to", or "coupled to" another component, it may be directly disposed/connected/coupled to another component, or an intervening third component may be also disposed therebetween. In contrast, when a component (or a region, a layer, a portion, or the like) is referred to as being related to another element such as being "directly on," "directly connected to" or "directly coupled to" another component, no other component or intervening third component are disposed therebetween.

Like reference numbers refer to like elements throughout. Also, in the drawing, the thicknesses, dimensions, and ratios of the components are exaggerated for effectively describing the technical features. "And/or" include one or more combinations in which the associated components may define.

Although the terms such as first and second are used herein to describe various components, these components should not be limited by these terms. The terms are only used to distinguish one component from other components. For example, a first component may be referred to as a second component, and similarly a second component may be referred to as a first component without departing from the scope of the invention.

The terminology used herein is for the purpose of describing aspects of embodiments only and is not intended to be limiting. The expression of a singular form may include plural forms unless definitely indicating aspects of case in terms of the context. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or."

Also, terms such as "below," "lower," "above," "upper" or the like may be used to describe the relationships of the components illustrated in the drawings. These terms have a relative concept, and are described on the basis of the directions illustrated in the drawings.

It should be understood that the terms such as "comprise," "include," "have," and the like intend to specify the presence of a feature, a fixed number, a step, an operation, a component, or a combination thereof described in the specification, but does not exclude the possibility of presence or addition of one or more other features, fixed numbers, steps, operations, components, or combinations thereof.

"About" or "approximately" as used herein is inclusive of the stated value and means within an acceptable range of deviation for the aspects of value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Present disclosures are described herein with reference to cross-section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the aspects of shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

FIG. 1 is an enlarged cross-sectional view of an embodiment of a display panel DP. In the present disclosure, a display panel DP may be a light emitting display panel. FIG. 1 illustrates an enlarged cross-section corresponding to a pixel among a plurality of pixels. Cross-sections corresponding to two transistors T1 and T2 and a light emitting element OLED are illustrated.

The display panel DP and components thereof may be disposed in a plane defined by a first direction DR1 and a second direction DR2 which cross each other. A thickness of the display panel DP and components thereof may be defined along a third direction DR3 which crosses each of the first direction DR1 and the second direction DR2.

In an embodiment, an upper surface of the display panel DP and each component thereof may be parallel to a plane defined by the first direction DR1 and the second direction DR2. A thickness direction of each component is defined along the third direction DR3. An upper side (or upper part) and a lower side (or lower part) of each component are defined along the third direction DR3. However, directions indicated by the first to third directions DR1, DR2 and DR3 may be relative concepts and may be changed into other directions.

As illustrated in FIG. 1, the display panel DP includes a base layer BL, a circuit element layer ML disposed over the base layer BL, a display element layer EL disposed over the circuit element layer ML, and a thin film encapsulation layer TFE as an insulating layer (hereinafter, an upper insulating layer or uppermost insulating layer) disposed over the display element layer EL. The circuit element layer ML may be connected to the display element layer EL. The circuit element layer ML may drive and/or control the display element layer EL to generate light, emit light, display an image, etc., without being limited thereto.

The base layer BL may include a synthetic resin layer. The synthetic resin layer is provided or formed on a support substrate used for manufacturing the display panel DP. Thereafter, a conductive layer and an insulating layer are formed on the synthetic resin layer. In the manufacturing of the display panel DP, when the support substrate is removed, the synthetic resin layer corresponds to the base layer BL.

The circuit element layer ML includes an insulating layer and a circuit element. The circuit element includes a signal line provided in plural (e.g., signal lines), a pixel driving circuit provided in plural (e.g., pixel driving circuits), and the like. The circuit element layer ML may be provided or formed through processes of forming an insulating layer, a semiconductor layer and a conductive layer, such as by coating, deposition and the like, and processes of patterning the insulating layer, the semiconductor layer and the conductive layer, such as by a photolithography process, without being limited thereto.

In the present disclosure, the circuit element layer ML includes a buffer layer BFL, a barrier layer BRL, a first insulating layer 10, a second insulating layer 20, a third insulating layer 30, a fourth insulating layer 40, a fifth insulating layer 50, a sixth insulating layer 60 and a seventh insulating layer 70 (e.g., first to seventh insulating layers 10 to 70). The buffer layer BFL, the barrier layer BRL and the first to seventh insulating layers 10 to 70 may include an inorganic layer (e.g., inorganic material) or an organic layer (e.g., organic material). The buffer layer BFL and the barrier layer BRL each may include an inorganic layer. At least one among the fifth to seventh insulating layers 50 to 70 may include an organic layer.

FIG. 1 exemplarily illustrates an arrangement of a first active layer A1 (or first active pattern), a second active layer A2 (or second active pattern), a first gate G1 (or first gate electrode), a second gate G2 (or second gate electrode), a first source S1 (or first source region), a second source S2 (or second source region), a first drain D1 (or first drain region), and a second drain (or second drain region) D2 constituting a first transistor T1 and a second transistor T2. In the present disclosure, the first active layer A1 and the second active layer A2 may include different materials from each other. The first active layer A1 may include a polysilicon semiconductor, and the second active layer A2 may include a metal oxide semiconductor (e.g., metal oxide semiconductor material). The first source S1 and the first drain D1 are regions having a relatively higher doping concentration than the first active layer A1 and function as electrodes. The second source S2 and the second drain D2 are regions in which the metal oxide semiconductor is reduced, and function as electrodes.

In an embodiment of the invention, the first active layer A1 and the second active layer A2 may include the same semiconductor material as each other, such that the stacked structure of the circuit element layer ML may be simplified.

The display element layer EL includes a pixel defining layer PDL and a light emitting element OLED. The light emitting element OLED may be an organic light emitting diode or a quantum dot light emitting diode. An anode AE (e.g., first electrode) is disposed over the seventh insulating layer 70. An opening PDL-OP of the pixel defining layer PDL exposes at least a portion of the anode AE. The opening PDL-OP of the pixel defining layer PDL may define a light emitting area PXA within a pixel. A non-light emitting area NPXA of the pixel may be adjacent to the light emitting area PXA. In an embodiment, the non-light emitting area NPXA of the pixel may surround the light emitting area PXA in a top plan view, without being limited thereto. The display panel DP may include a non-light emitting area NPXA and a light emitting area PXA corresponding to those described above for the pixel.

A hole control layer HCL and an electron control layer ECL may be commonly disposed in both the light emitting area PXA and the non-light emitting area NPXA. An emission layer EML may be provided in the form of a pattern to correspond to the opening PDL-OP. Compared to the hole control layer HCL and the electron control layer ECL in the form of a film disposed commonly across the light emitting area PXA and the non-light emitting area NPXA, the emission layer EML as a pattern may be provided as a discrete element corresponding to the opening PDL-OP. In an embodiment of a method of manufacturing the display panel DP, the hole control layer HCL and the electron control layer ECL may be commonly provided or formed in a plurality of pixels using an open mask. A cathode CE (e.g., second electrode) is disposed over the electron control layer ECL.

A thin film encapsulation layer TFE is disposed over the cathode CE. The thin film encapsulation layer TFE may encapsulate the display element layer E1 within the display panel DP. The thin film encapsulation layer TFE may include a plurality of thin films. The plurality of thin films may include an inorganic layer and an organic layer. The thin film encapsulation layer TFE may include an insulating layer for encapsulating the display element layer EL and an insulating layer for improving light extraction efficiency. The thin film encapsulation layer TFE may be deposited on the display element layer EL through the metal mask of one embodiment. In an embodiment of a method of manufacturing the display panel DP, the thin film encapsulation layer TFE may be deposited on the display element layer EL through a metal mask MSK.

The thin film encapsulation layer TFE may include or be defined by a deposition pattern ECP. The deposition pattern ECP may include a plurality of thin films. The plurality of thin films may include an inorganic layer and an organic layer. The deposition pattern ECP may include an insulating layer for encapsulating the display element layer EL and an insulating layer for improving light extraction efficiency. In an embodiment of a method of manufacturing the display panel DP, the deposition pattern ECP may be deposited on the display element layer EL through a metal mask MSK (e.g., metal deposition mask).

Figure 2:
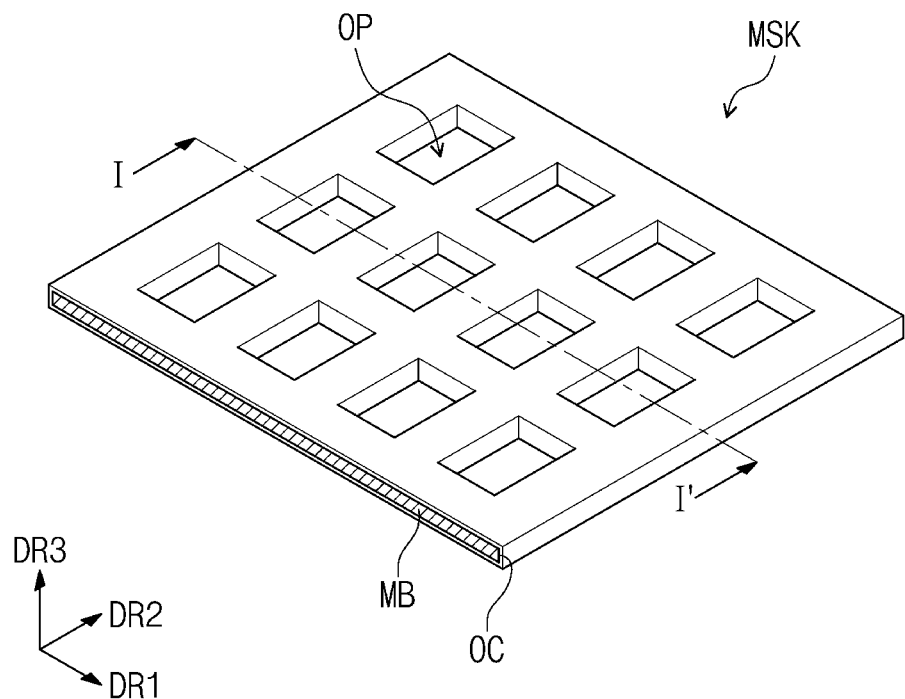
FIG. 2 is a perspective view of an embodiment of a metal mask.
Figure 3:
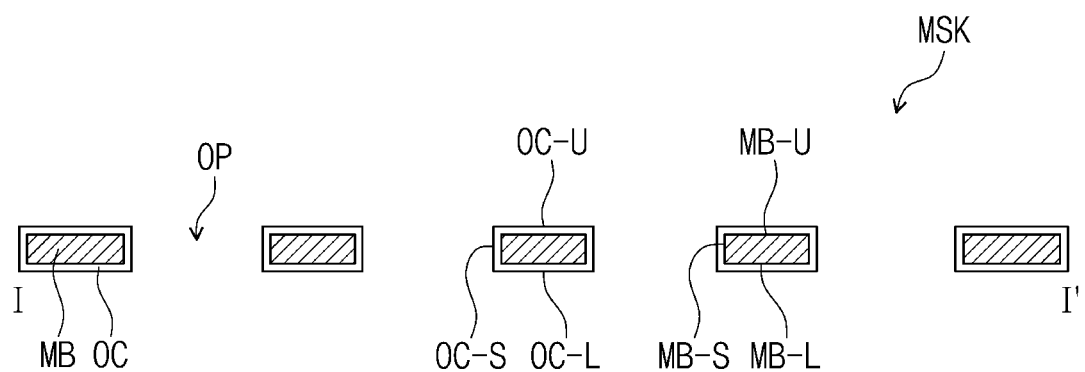
FIG. 3 is an enlarged cross-sectional view of a metal mask.

FIG. 2 is a perspective view of an embodiment of a metal mask MSK. FIG. 3 is a cross-sectional view of the metal mask MSK. FIG. 3 illustrates a cross-section taken along I-I' in FIG. 2.

As illustrated in FIGS. 2 and 3, a metal mask MSK includes a mask body MB and a coating layer OC (e.g., overcoat). The coating layer OC is disposed over an outer surface of the mask body MB. The mask body MB and/or the coating layer OC defines one or more of a solid portion of the metal mask MSK. Solid portions may be spaced apart from each other along the metal mask MSK.

A through portion OP (e.g., deposition opening through which a deposition material DM passes) is defined in the mask body MB. Solid portions of the metal mask MSK which are spaced apart from each other define the through portion OP. The through portion OP provided in plural (e.g., a plurality of through portions OP) are defined in the mask body MB. The plurality of through portions OP may be spaced apart from each other at regular intervals along the first direction DR1 and/or the second direction DR2, and may form a regular pattern along the metal mask MSK. The plurality of through portions OP may alternate with solid portions of the metal mask MSK to define a pattern for deposition of a deposition material DM. In an embodiment, each of the plurality of through portions OP may be defined penetrating a thickness of the metal mask MSK along the third direction DR3.

The mask body MB includes one metal or a plurality of metals (e.g., metal mask body). The mask body MB may include iron and nickel. The mask body MB may include an alloy of iron and nickel. The mask body MB may include or be formed of an alloy of iron and nickel. Although not limited thereto, the mask body MB may include invar. In the alloy of iron and nickel, the percentage of nickel content may range from about 30 weight percent (wt %) to about 40 wt % with respect to a total of 100 wt % for the mask body MB. More specifically, in the alloy of iron and nickel, the percentage of nickel content may range from about 33 wt % to about 37 wt % with respect to a total of 100 wt % for the mask body MB. That is, within the mask body MB, the alloy of iron and nickel includes nickel in a range of about 30 wt % to about 40 wt % with respect to a total of 100 wt % for the mask body MB.

The coating layer OC may be disposed over an outer surface of the mask body MB and cover the outer surface of the mask body MB. The coating layer OC may define an outer surface of the metal mask MSK. The coating layer OC includes aluminum oxynitride. The coating layer OC may include a material in which aluminum oxide and aluminum nitride are covalently bonded. The coating layer OC may include aluminum oxynitride represented by $AlN_x \cdot (Al_2O_3)_{1-x}$ (x=0.1 to 0.9). In this case, x may be 0.5. That is, aluminum oxide and aluminum nitride may be included in the coating layer OC in a state in which they are covalently bonded at a 1:1 ratio.

The coating layer OC may include an inner coating layer OC-S disposed over inner walls MB-S (e.g., side surface or sidewall) which define through portions OP of the mask body MB. The coating layer OC may include an upper coating layer OC-U disposed over an upper surface MB-U of the mask body MB and a lower coating layer OC-L disposed over a lower surface MB-L of the mask body MB, in addition to the inner coating layer OC-S disposed over the inner walls MB-S at the through portions OP. The inner walls MB-S of the mask body MB connect the upper surface MB-U and the lower surface MB-L to each other, and the inner walls MB-S define deposition openings of the metal mask MSK corresponding to the through portions OP.

The coating layer OC may be disposed over a front surface of the mask body MB to cover the front surface of the mask body MB. The coating layer OC may contact an outer surface of the mask body MB. The coating layer OC may contact all of the inner walls MB-S, the upper surface MB-U, and the lower surface MB-L of the mask body MB. As contacting all of the inner walls MB-S, the upper surface MB-U, and the lower surface MB-L of the mask body MB, the mask body MB may not be exposed to outside the metal mask MSK.

A thickness of the coating layer OC may be taken in a normal direction relative to a surface of mask body MB from which a respective portion of coating layer OC is extended. The thickness of the coating layer OC may be about 0.1 micrometer (μm) to about 10 micrometers (μm). In the case that the thickness of the coating layer OC is less than 0.1 μm, the lifespan improvement may not be secured when the metal mask MSK is used in a deposition process for forming a pattern. In the case that the thickness of the coating layer OC is larger than 10 μm, the deposition precision may be degraded when the metal mask MSK is used in the deposition process.

The metal mask MSK according to an embodiment includes a coating layer OC including aluminum oxynitride, on an outer surface of the mask body MB including a metal. The aluminum oxynitride included in the coating layer OC may be obtained by a covalent bond of aluminum oxide and aluminum nitride. Aluminum oxide of the aluminum oxynitride included in the coating layer OC may be corrosion resistant to a fluorine-based compound. Aluminum nitride of the aluminum oxynitride included in the coating layer OC may have superior insulation properties and relatively higher hardness than aluminum oxide. The coating layer OC provided on the outer surface of the metal mask MSK according to an embodiment includes aluminum oxynitride in which aluminum oxide and aluminum nitride are covalently bonded, thereby improving the durability of the metal mask MSK due to relatively high insulating properties and hardness while reducing or effectively preventing corrosion of the metal mask MSK by the fluorine-based compound in the deposition process. In addition, a width of a shadow portion generated in the deposition process may be reduced by the coating layer OC including aluminum oxynitride, thereby realizing a more precise deposition process in forming a deposition pattern ECP.

FIGS. 4A to 4E are perspective views illustrating an embodiment of a method of manufacturing a display panel using a metal mask MSK. FIG. 4F is a cross-sectional view illustrating an embodiment of a display panel DP manufactured using a metal mask MSK. FIGS. 5A to 5C are enlarged cross-sectional views illustrating processes in an embodiment of a method of manufacturing a display panel DP using a metal mask MSK. FIGS. 5A to 5C illustrate cross-sections taken along II-II' in FIG. 4B. The same reference numerals are given to the same components as those described with reference to FIGS. 1 to 3, and redundant descriptions are omitted.

Figure 4A:
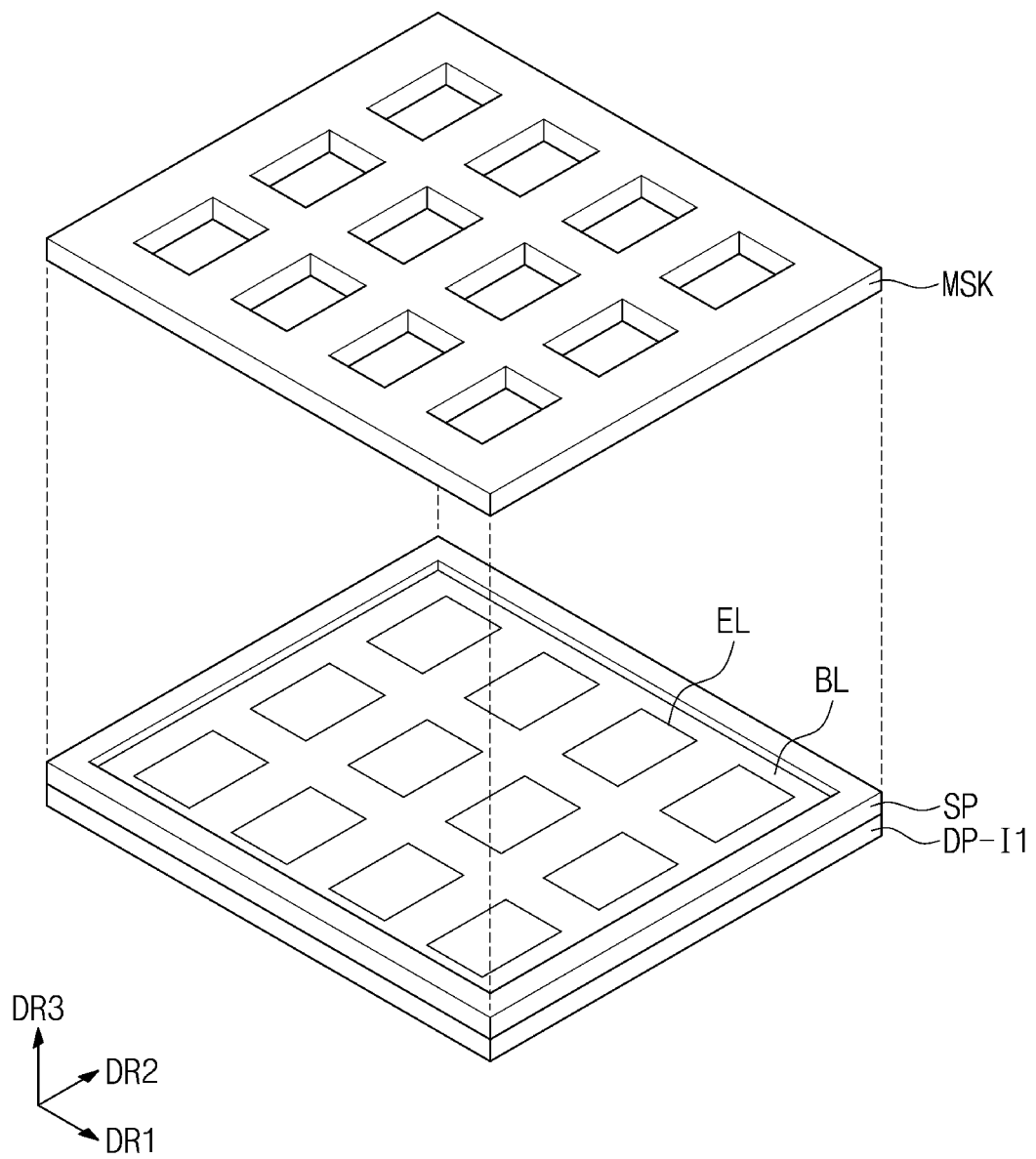
FIGS. 4A to 4E are perspective views illustrating processes in a method of manufacturing a display panel using a metal mask.
Figure 4B:
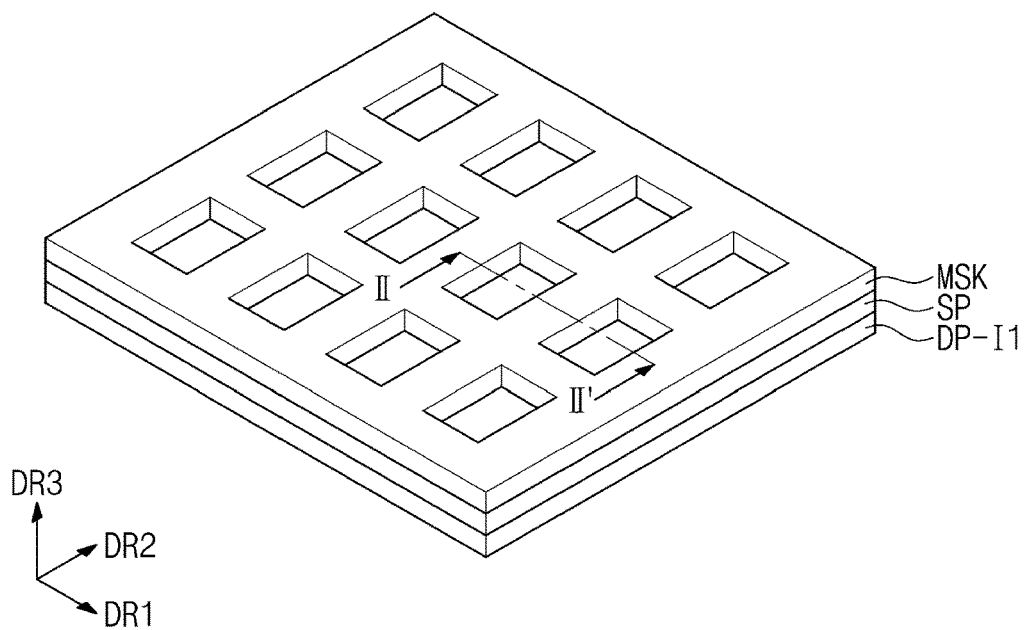
Figure 5A:
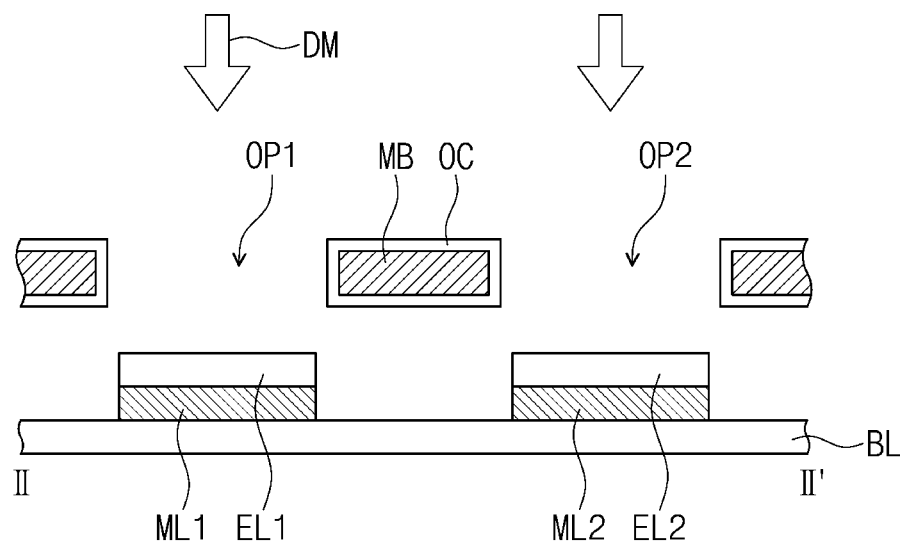
FIGS. 5A to 5C are cross-sectional views illustrating processes in an embodiment of a method for manufacturing a display panel using a metal mask.
Figure 5B:
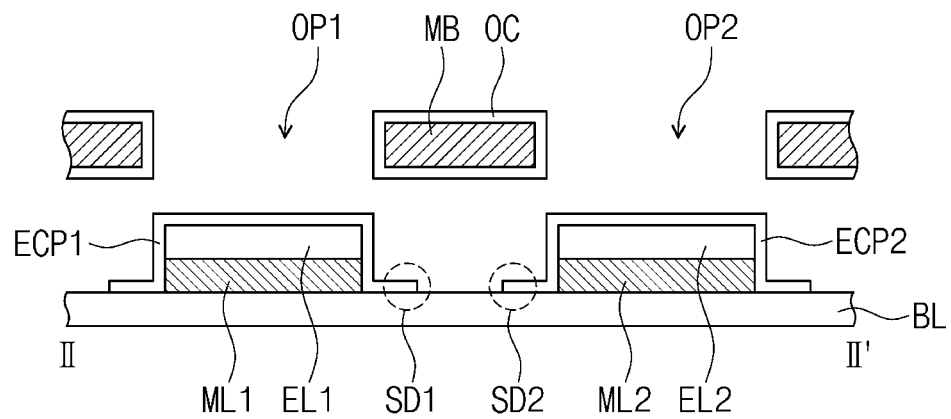
Figure 5C:
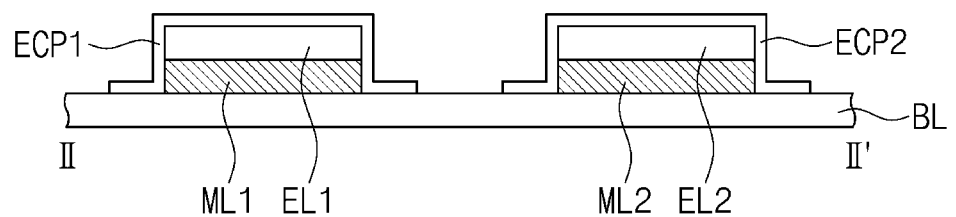

As shown in FIGS. 4A and 4B, the metal mask MSK is disposed over a target substrate DP-I1. In the present disclosure, it is exemplarily illustrated that the metal mask MSK includes a plurality of through portions OP arranged along the first direction DR1 and along the second direction DR2, but the invention is not limited thereto, and the through portion OP of the metal mask MSK may have various shapes and arrangements. In addition, in FIGS. 2A and 2B, it is exemplarily illustrated that one metal mask MSK is disposed over the target substrate DP-I1, but the metal mask MSK provided in plural (e.g., a plurality of metal masks MSK) may be disposed over a same one of the target substrate DP-I1.

As shown in FIGS. 4A and 4B, in the present disclosure, a support SP may be disposed between the metal mask MSK and the target substrate DP-I1. The support SP may be provided in the form of a frame having an open area which exposes a portion of the target substrate DP-I1. The open area may correspond to a deposition area of the target substrate DP-I1 at which a deposition material DM is provided to the target substrate DP-I1 via the metal mask MSK. However, the invention is not limited thereto, and the support SP may be disposed without limitation on any area of the target substrate DP-I1 corresponding to an area except the through portion OP of the metal mask MSK. The through portion OP of the metal mask MSK may define a deposition area of the metal mask MSK. An area of the metal mask MSK except for the through portion OP may define a non-deposition area of the metal mask MSK. The deposition area of the metal mask MSK may correspond to a deposition area of the target substrate DP-I1 at which a deposition material DM and/or a deposition pattern ECP is provided. The non-deposition area of the metal mask MSK may correspond to a non-deposition area of the target substrate DP-I1 at which a deposition material DM and/or a deposition pattern ECP is not provided. The deposition pattern ECP may correspond to the display panel DP overall and/or an element of the display panel DP provided using the metal mask MSK.

The metal mask MSK may be combined with the support SP and to provide an integral body. In the present disclosure, the support SP may reduce or effectively prevent direct contact between the plurality of metal masks MSK and the target substrate DP-I1. Accordingly, damage to the target substrate DP-I1 due to contact with the metal mask MSK may be reduced or effectively prevented. However, this is merely exemplary, and in one or more embodiment of a method of manufacturing of a display panel DP, the support SP may be omitted, the metal mask MSK may be directly contact the target substrate DP-I1.

A portion of the target substrate DP-I1 exposed by the support SP to outside the support SP may correspond to a region where the through portion OP of the metal mask MSK is defined. The display element layer EL in plural (e.g., plurality of display element layers EL or display element patterns) are provided or formed on the target substrate DP-I1. As providing the plurality of display element layers EL, the metal mask MSK may be disposed such that the region where the plurality of display element layers EL are provided formed on the target substrate DP-I1 overlaps the region in which the through portion OP of the metal mask MSK is defined.

Figure 4C:
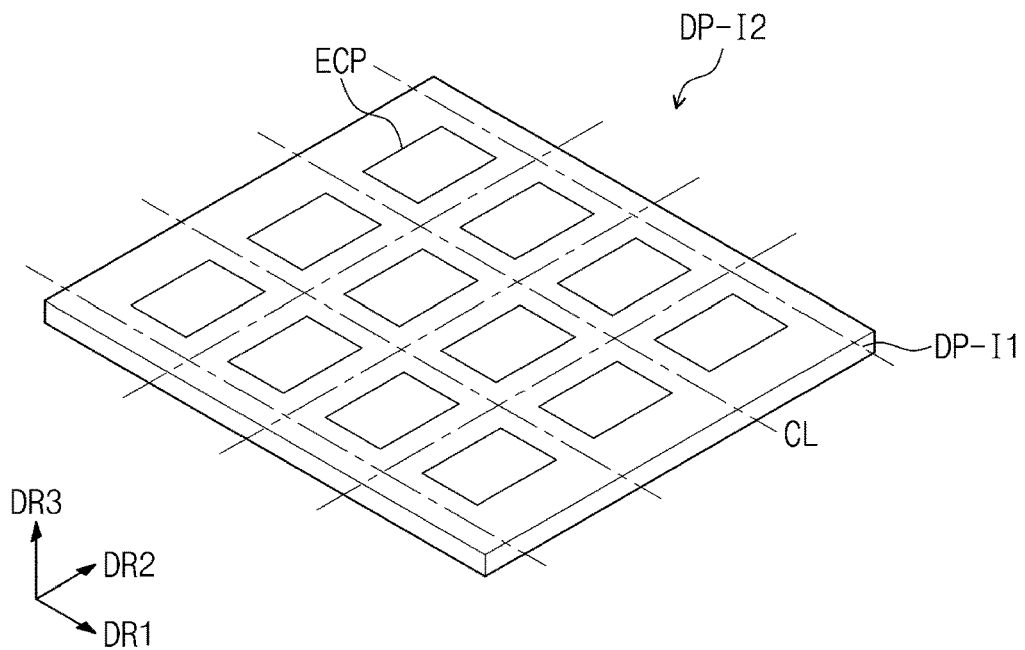

Referring to FIG. 4C, after the metal mask MSK is disposed over the target substrate DP-I1, the deposition pattern ECP in plural (e.g., a plurality of deposition patterns ECP) are provided or formed in a region corresponding to the through portion OP of the metal mask MSK through a deposition process and then the metal mask MSK is removed. A preliminary target substrate DP-I2 from which the metal mask MSK has been removed may have a plurality of deposition patterns ECP provided or formed on the target substrate DP-I1. The deposition patterns ECP may be provided or formed corresponding to the through portions OP of the metal mask MSK. In the present disclosure, a total of twelve of the plurality of deposition patterns ECP are provided spaced apart from each other along the target substrate DP-I1. In an embodiment, each of the plurality of deposition patterns ECP may include a plurality of inorganic layers and one organic layer along a thickness direction, and the inorganic layers and the organic layer included in each of the plurality of deposition patterns ECP may respectively correspond to the through portions OP.

Figure 4D:
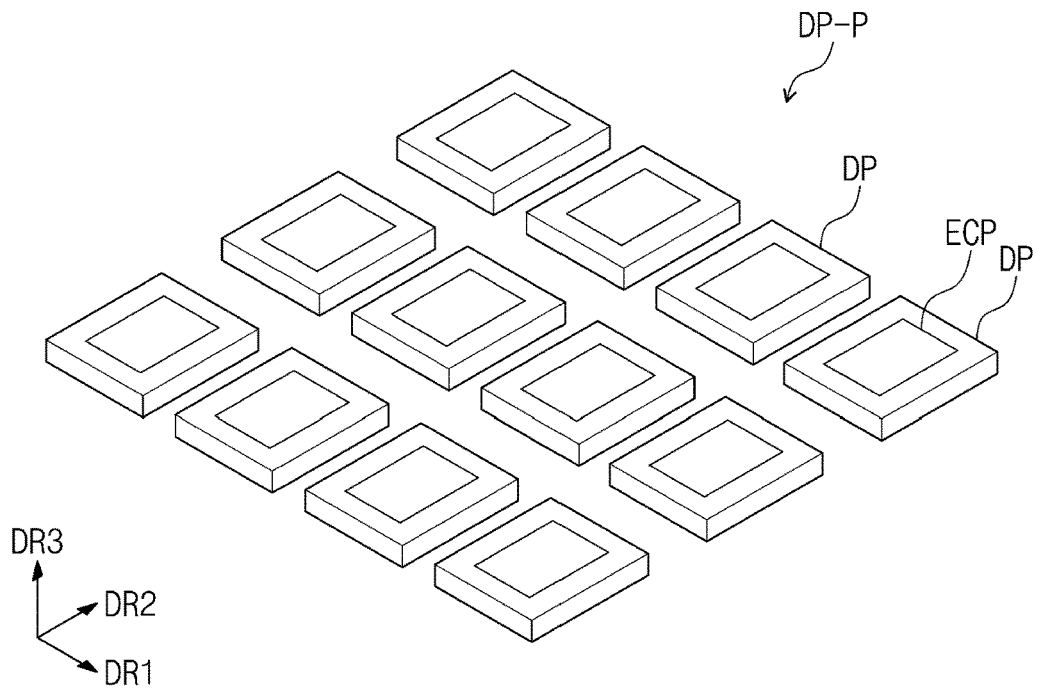

Referring to FIGS. 4C and 4D, a panel DP-P in plural (e.g., a plurality of panels DP-P) may be provided or formed by separating portion of the preliminary target substrate DP-I2 from which the metal mask MSK has been removed, along a cutting line CL provided in plural (e.g., cutting lines CL defined relative to the preliminary target substrate DP-I2). Each of the panels DP-P may be a preliminary form of the display panel DP (e.g., preliminary display panel) which forms a display panel DP. In an embodiment, the method may include dividing preliminary target substrate DP-I2 into portions respectively corresponding to the plurality of deposition patterns ECP. That is, the through portions OP of the metal mask MSK may respectively correspond to a display panel DP. In an embodiment, a shape of the through portion OP of the metal mask MSK may correspond to a shape of the display panel DP, where shapes are defined along the first direction DR1 and the second direction DR2.

According to one or more embodiment, since the plurality of panels DP-P can be provided or formed by patterning a single one of the target substrate DP-I1, the process time for forming a display panel DP can be shortened and the process cost can be reduced. However, this is exemplarily illustrated, and in an embodiment, a single one of the display panel DP may be provided from a single one of the target substrate DP-I1 according to the size of the display panel DP relative to the target substrate DP-I1, and the invention is not limited to any one embodiment.

Figure 4E:
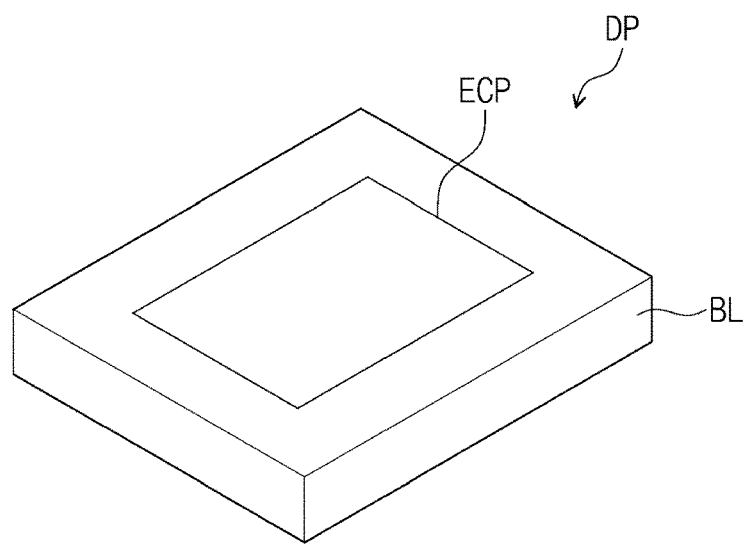
Figure 4F:
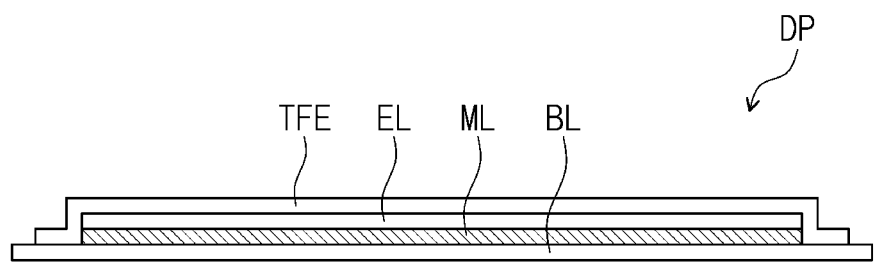
FIG. 4F is a cross-sectional view illustrating an embodiment of a display panel manufactured using a metal mask.

Referring to FIGS. 4E and 4F, the display panel DP includes a base layer BL and a deposition pattern ECP which is disposed over the base layer BL. The deposition pattern ECP may be disposed to cover the circuit element layer ML and the display element layer EL which are disposed over the base layer BL. The description in FIG. 1 may be equally applied to a specific configuration of the base layer BL, the circuit element layer ML and the display element layer EL.

Hereinafter, an embodiment of a process of forming a deposition pattern ECP will be described with reference to FIGS. 5A to 5C.

FIG. 5A is a cross-sectional view corresponding to the target substrate DP-I1 shown in FIGS. 4A and 4B. Referring to FIG. 5A, the target substrate DP-I1 may include a base layer BL, a first circuit element layer ML1 (e.g., circuit element pattern) and a second circuit element layer ML2 (e.g., circuit element layers ML1 and ML2), and a first display element layer EL1 (e.g., display element pattern) and a second display element layer EL2 (e.g., display element layers EL1 and EL2). For convenience of description, the present disclosure schematically illustrates a stacked structure of the circuit element layers ML1 and ML2 and the display element layers EL1 and EL2. The circuit element layers ML1 and ML2 and the display element layers EL1 and EL2 may be disposed in order from the base layer BL, without being limited thereto. The aforementioned layers of the target substrate DP-I1 may be provided before the metal mask MSK is disposed over the target substrate DP-I1, without being limited thereto.

The base layer BL may include a plastic substrate, a glass substrate, a metal substrate, or the like. The plastic substrate includes a resin. In an embodiment, for example, the base layer BL may include at least any one material among an acrylic resin, a methacrylic resin, polyisoprene, a vinylic resin, an epoxy-based resin, a urethane-based resin, a cellulose-based resin, a siloxane-based resin, a polyimide-based resin, a polyamide-based resin and a perylene-based resin.

The circuit element layers ML1 and ML2 may include a plurality of insulating layers and at least one transistor. The display element layers EL1 and EL2 may include a pixel defining layer PDL and a light emitting element OLED. The circuit element layers ML1 and ML2 may include the first circuit element layer ML1 and the second circuit element layer ML2 spaced apart from each other along the first direction DR1, along the base layer BL. The display element layers EL1 and EL2 may include the first display element layer EL1 disposed corresponding to the first circuit element layer ML1, and a second display element layer EL2 disposed corresponding to the second circuit element layer ML2. In an embodiment, the first display element layer EL1 and the second display element layer EL2 may be defined as display element patterns adjacent to each other along the base layer BL.

In the present disclosure, a first through portion OP1 and a second through portion OP2 (e.g., the through portions OP1 and OP2) of the metal mask MSK may be disposed corresponding to the display element layers EL1 and EL2, respectively. A plurality of through portions OP1 and OP2 are defined in the metal mask MSK, and the plurality of through portions OP1 and OP2 is disposed respectively corresponding to the plurality of display element layers EL1 and EL2. In FIG. 5A, a first through portion OP1 corresponds to the first display element layer EL1 and a second through portion OP2 corresponds to the second display element layer EL2, may be defined in the metal mask MSK.

Referring to 5A and 5B, in an embodiment of a method of manufacturing a display panel DP, a first deposition pattern ECP1 and a second deposition pattern ECP2 (e.g., a plurality of deposition patterns ECP1 and ECP2) are provided or formed by passing a deposition material DM through the through portions OP1 and OP2 of the metal mask MSK. The plurality of deposition patterns ECP1 and ECP2 may be provided or formed to cover each of the plurality of display element layers EL1 and EL2 and the plurality of circuit element layers ML1 and ML2. In an embodiment of a method of manufacturing a display panel DP, the deposition material DM is deposited onto the target substrate DP-I1 at regions thereof respectively corresponding to the through portions OP1 and OP2 of the metal mask MSK, to form a first deposition pattern ECP1 covering the first display element layer EL1, and a second deposition pattern ECP2 covering the second display element layer EL2.

The deposition material DM may include an organic material and/or an inorganic material. The deposition material DM may include a plurality of organic and inorganic materials according to the stacked structure of layers within respective ones of the deposition patterns ECP1 and ECP2. In an embodiment, the deposition patterns ECP1 and ECP2 include two inorganic layers and one organic layer disposed therebetween along a thickness direction. To provide the two inorganic layers and the one organic layer disposed therebetween along a thickness direction, the deposition material DM may be provided by alternately arranging a first inorganic material, the organic material, and a second inorganic material on the target substrate DP-I1, to conform to the stacked structure.

The deposition patterns ECP1 and ECP2 may be provided or formed by depositing the deposition material DM onto the target substrate DP-I1 through various deposition methods. In an embodiment, the deposition patterns ECP1 and ECP2 may be deposited through chemical vapor deposition ("CVD").

The plurality of deposition patterns ECP1 and ECP2 may each be a thin film encapsulation layer TFE which encapsulates the display element layers EL1 and EL2. The deposition patterns ECP1 and ECP2 may include a first inorganic layer (e.g., first inorganic pattern), an organic layer (e.g., an organic pattern) and a second inorganic layer (e.g., second inorganic pattern). The first inorganic layer and the second inorganic layer may include silicon nitride, silicon oxide, or a combination thereof. The first inorganic layer and the second inorganic layer may be formed through chemical vapor deposition ("CVD"). The first inorganic layer, the organic layer and the second inorganic layer may be provided in order from a respective one of the display element layers EL1 and EL2.

Within the deposition pattern ECP, the organic layer may provide a flat surface on the first inorganic layer. Irregularities formed on an upper surface of the first inorganic layer or particles present on the first inorganic layer are covered by the organic layer, to block the first inorganic layer from affecting upper layers or components, such as the second inorganic layer provided or formed on the organic layer. In addition, the organic layer can relieve stress between the layers in contact with each other within the deposition pattern ECP. The organic layer may include an organic material and may be provided or formed through a solution process such as spin coating, slit coating, or inkjet process.

Regions of the deposition patterns ECP1 and ECP2 corresponding to the through portions OP1 and OP2 may be defined by a dimension of the through portions OP1 and OP2 taken along the first direction DR1 and/or the second direction DR2. Referring to FIG. 5B, when providing or forming the plurality of deposition patterns ECP1 and ECP2 according to an embodiment, in addition to the regions of the deposition patterns ECP1 and ECP2 corresponding to the through portions OP1 and OP2 of the metal mask MSK, a first shadow SD1 and a second shadow SD2 (e.g., shadows SD1 and SD2) of the deposition patterns ECP1 and ECP2 may be provided or formed by the deposition material DM extended to a region of the target substrate DP-I1 which corresponds to the metal mask MSK. The region of the target substrate DP-I1 which corresponds to the metal mask MSK may face a bottom portion (e.g., a bottom surface) of the metal mask MSK. The shadows SD1 and SD2 of the deposition patterns ECP1 and ECP2 may be spaced apart from each other. That is, the deposition patterns ECP1 and ECP2 may be disconnected from each other at the shadows SD1 and SD2.

When the shadows SD1 and SD2 of the deposition patterns ECP1 and ECP2 are provided or formed in a relatively wide area, the shadows SD1 and SD2 of the deposition patterns ECP1 and ECP2 adjacent to each other may contact each other, so that a short or crack may occur. Although not shown, the shadows SD1 and SD2 of the deposition patterns ECP1 and ECP2 may be provided or formed on elements such as a pad part and the like included in the display panel DP, thereby causing a defect in the display panel DP. Specifically, in the cutting of the preliminary target substrate DP-I2 illustrated in FIGS. 4C and 4D, defects such as film delamination or crack may occur in the process of separating the shadows SD1 and SD2 in contact with each other.

In the method of manufacturing a display panel according to an embodiment, the coating layer OC forms an outer surface of the metal mask MSK used in the deposition process, and the coating layer OC includes aluminum oxynitride. Thus, a range in which the shadows SD1 and SD2 of the deposition patterns ECP1 and ECP2 occur is reduced. More particularly, as compared to a mask in which the coating layer OC includes aluminum oxide, one or more embodiment of the metal mask MSK reduces or effectively prevents corrosion of the metal mask MSK by maintaining corrosion resistance relative to a fluorine-based compound applied in the deposition process. Therefore, defects occurring in the display panel DP can also be reduced or effectively prevented by reducing a range to which the shadows SD1 and SD2 extend, and the process reliability in forming the display panel DP can be improved.

Figure 6A:
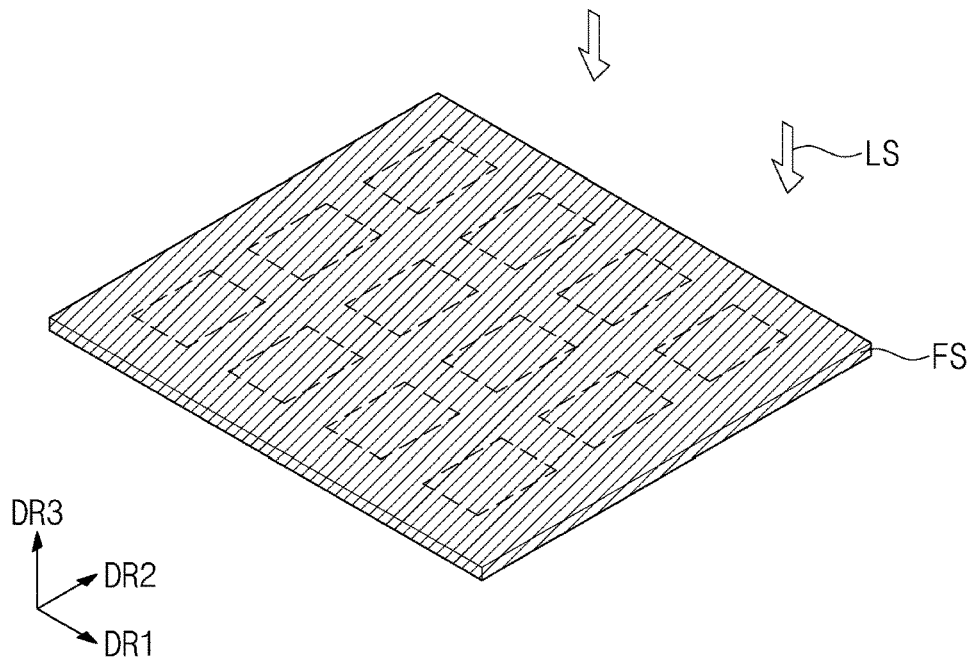
FIGS. 6A to 6C are perspective views illustrating processes in an embodiment of a method for manufacturing a metal mask.
Figure 6B:
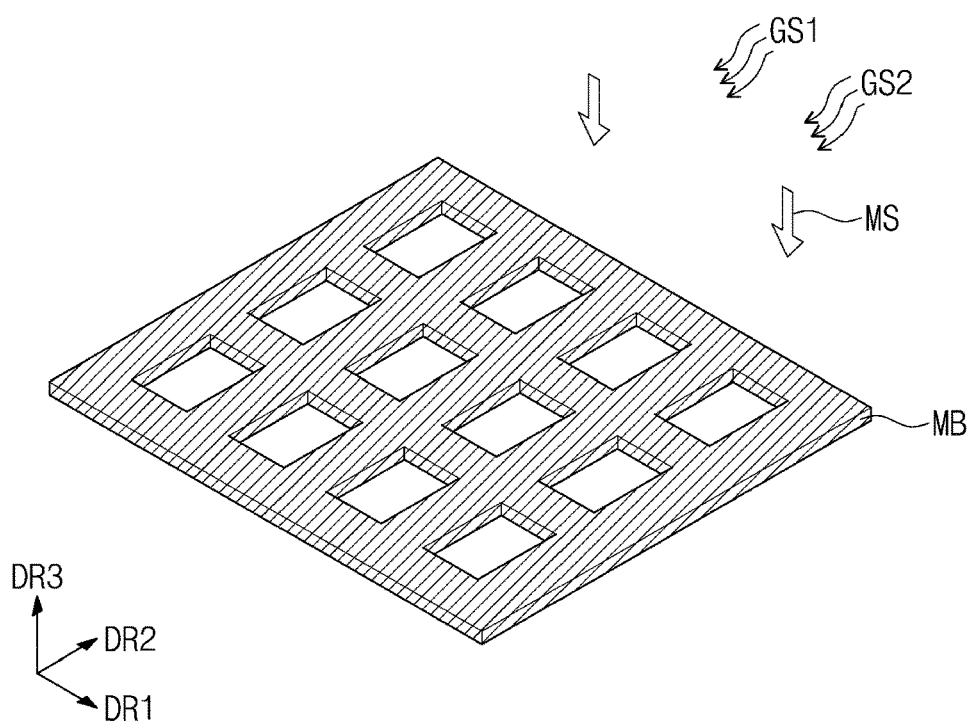
Figure 6C:
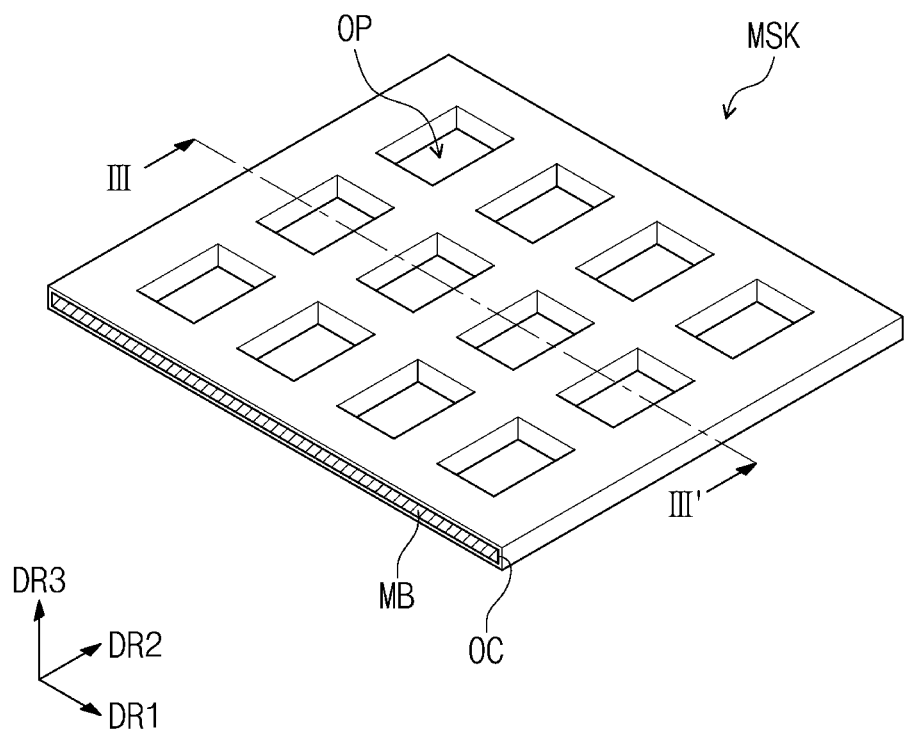
Figure 6D:
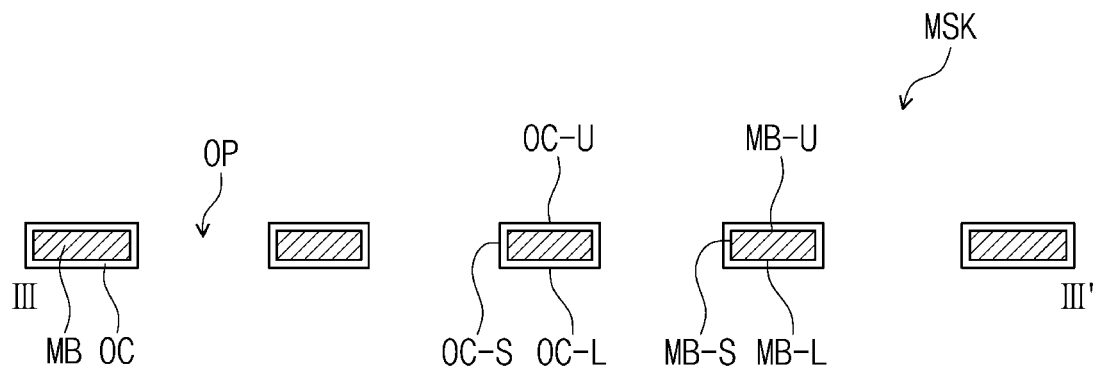
FIG. 6D is an enlarged cross-sectional view illustrating a cross-section taken along line III-III' in FIG. 6C.

FIGS. 6A to 6C are perspective views sequentially illustrating processes in an embodiment of a method of manufacturing a metal mask MSK. FIG. 6D is an enlarged cross-sectional view illustrating a process in an embodiment of a method of manufacturing a metal mask MSK. FIG. 6D illustrates a cross-section taken along in FIG. 6C.

As shown in FIG. 6A, the method of manufacturing a metal mask MSK according to an embodiment may include irradiating a laser LS to a base material sheet FS. The laser LS may be irradiated along guide lines (shown as dotted lines in FIG. 6A). The guide lines may correspond to a through portion OP. The guide lines may correspond to the inner walls MB-S of the mask body MB shown in FIG. 3, without being limited thereto.

The base material sheet FS (e.g., base metal sheet) may include iron and nickel. The base material sheet FS may include or be formed through a combination of iron and nickel. In an embodiment, the base material sheet FS may be provided or formed by cutting a metal thin film formed from an iron and nickel alloy, into a predetermined size.

As shown in FIGS. 6A to 6C, a plurality of through portions OP are provided or formed by applying the laser LS to the base material sheet FS to form a mask body MB, and then by depositing a coating material MS on the mask body MB. In an embodiment, the coating material MS may include aluminum. The coating material MS may be aluminum metal. In the depositing of the coating material MS, aluminum may be deposited on the surface of the mask body MB through a sputtering process.

In the depositing of the coating material MS on the mask body MB, a plurality of gases GS1 and GS2 may be supplied together, to the mask body MB. The plurality of gases GS1 and GS2 may be oxygen gas GS1 and nitrogen gas GS2. In the depositing of the coating material MS on the mask body MB, the coating layer OC provided or formed by supplying the oxygen gas GS1 and the nitrogen gas GS2 together while depositing aluminum as the coating material MS, may include aluminum oxide and aluminum nitride. The coating layer OC may include aluminum oxynitride in which aluminum oxide and aluminum nitride are covalently bonded. That is, providing of the coating material MS includes providing the coating material MS including aluminum, together with the oxygen gas GS1 and the nitrogen gas GS2, on the mask body MB.

As shown in FIG. 6D, the coating layer OC is provided or formed on the inner walls MB-S of the plurality of through portions OP defined in the mask body MB. The coating layer OC may be formed on all of the upper surface MB-U, the lower surface MB-L of the mask body MB, and the inner walls MB-S of the mask body MB at the through portion OP, through the deposition process. The coating layer OC includes an inner coating layer OC-S provided or formed on the inner walls MB-S of the through portions OP, an upper coating layer OC-U provided or formed on the upper surface MB-U, and a lower coating layer OC-L provided or formed on the lower surface MB-L.

In one or more embodiment of the method of manufacturing a metal mask MSK, after the through portions OP are defined in a base metal sheet, the coating layer OC is provided or formed on both the inner walls MB-S which face each other to define the through portions OP, and on the upper and lower surfaces of the base metal sheet through a deposition process. Thus, corrosion of the metal mask MSK which is used in a deposition process, due to a fluorine-based compound or the like in the deposition process, is reduced or effectively prevented to provide a highly durable metal mask MSK.

According to one or more embodiment of the invention, corrosion of a deposition mask for forming an encapsulation pattern and the like may be reduced or effectively prevented. Additionally, forming of a shadow of the encapsulation pattern during a deposition process may be reduced or effectively prevented, so that defects in a display panel DP formed using the deposition mask can be reduced or effectively prevented.

Although the invention has been described with reference to embodiments, it will be understood by those skilled in the art that various changes in form and details may be made therein without departing from the spirit and scope of the invention.

Accordingly, the technical scope of the invention is not intended to be limited to the contents set forth in the detailed description of the specification, but is intended to be defined by the appended claims.

What is claimed is:

1. A deposition mask comprising:
    a metal mask body in which a deposition opening is defined; and
    a coating layer comprising an aluminum oxynitride layer, on an outer surface of the metal mask body,
    wherein the aluminum oxynitride layer forms an outer surface of the deposition mask,
    wherein the metal mask body comprises:
        the outer surface comprising an upper surface and a lower surface which is opposite to the upper surface, and
        an inner wall extending between the upper surface and the lower surface, the inner wall defining the deposition opening,
    wherein the aluminum oxynitride layer which forms the outer surface of the deposition mask comprises:
        an upper coating layer covering the upper surface of the metal mask body,
        a lower coating layer covering the lower surface of the metal mask body, and
        an inner coating layer covering the inner wall of the metal mask body,
    wherein the aluminum oxynitride of each of the upper coating layer, the lower coating layer and the inner coating layer is represented by $AlN_x \cdot (Al_2O_3)_{1-x}$ ($x=0.1$-$0.9$), and
    wherein the aluminum oxynitride of each of the upper coating layer, the lower coating layer and the inner coating layer comprises aluminum oxide and aluminum nitride which are covalently bonded with each other.

2. The deposition mask of claim 1, wherein the x is 0.5.

3. The deposition mask of claim 1, wherein the metal mask body comprises iron and nickel.

4. The deposition mask of claim 3, wherein the metal mask body comprises an alloy of iron and nickel.

5. The deposition mask of claim 4, wherein within the metal mask body, the alloy of iron and nickel includes nickel in a range of about 30 wt % to about 40 wt % with respect to a total of 100 wt % for the metal mask body.

6. The deposition mask of claim 1, wherein the aluminum oxynitride layer which forms the outer surface of the deposition mask contacts the metal mask body.

7. The deposition mask of claim 1, wherein a thickness of the coating layer which comprises the aluminum oxynitride and is on the outer surface of the metal mask body is about 0.1 micrometer to about 10 micrometers.

* * * * *